United States Patent [19]

Brunner et al.

[11] Patent Number: 4,748,407

[45] Date of Patent: May 31, 1988

[54] METHOD AND APPARATUS FOR MEASURING TIME DEPENDENT SIGNALS WITH A PARTICLE PROBE

[75] Inventors: Matthias Brunner, Kirchheim; Reinhold Schmitt; Dieter Winkler, both of Munich, all of Fed. Rep. of Germany

[73] Assignee: Siemens Aktiengesellschaft, Berlin and Munich, Fed. Rep. of Germany

[21] Appl. No.: 16,696

[22] Filed: Jan. 28, 1987

[30] Foreign Application Priority Data

Feb. 6, 1986 [DE] Fed. Rep. of Germany ....... 3603724

[51] Int. Cl.$^4$ ................ G01N 23/225; G01R 31/28
[52] U.S. Cl. ................ 324/158 R; 324/158 D; 324/73 R
[58] Field of Search ............ 324/73 R, 158 R, 158 D; 250/310, 311, 397, 492.1

[56] References Cited

U.S. PATENT DOCUMENTS

3,694,635 9/1972 Hoetzel et al. ............... 250/310 X
4,675,602 6/1987 Feuerbaum et al. ............ 324/158 R

OTHER PUBLICATIONS

H. P. Feuerbaum, "VLSI Testing Using the Electron Probe", Scanning Electrom Microscopy/1979/I, pp. 285–296.

H. P. Feuerbaum, "Electron Beam Testing: Methods and Applications", Scanning, vol. 5, (1983), pp. 14–24.

*Primary Examiner*—Ernest F. Karlsen
*Assistant Examiner*—Vinh P. Nguyen
*Attorney, Agent, or Firm*—Hill, Van Santen, Steadman & Simpson

[57] ABSTRACT

To measure high frequency signal curves at nodes and interconnections of integrated circuits and achieve a good chronological resolution in accordance with the sampling method, extremely short primary electron pulses are used. For such extremely short pulse widths obtainable with beam blanking systems, only individual statistically appearing secondary electrons are registered per pulse, these electrons generating current pulses having different amplitudes and different time behaviors at the output of an energy analyzer. It is proposed that the number of current pulses occurring at the output of the energy analyzer within a prescribed time interval be identified and the quotient, or ratio, thereof, be kept constant with the assistance of a feedback circuit for connection to the voltage of a retarding field electrode. The feedback circuit includes a pulse counter, a digital-to-analog converter, and a spectrometer drive.

9 Claims, 1 Drawing Sheet

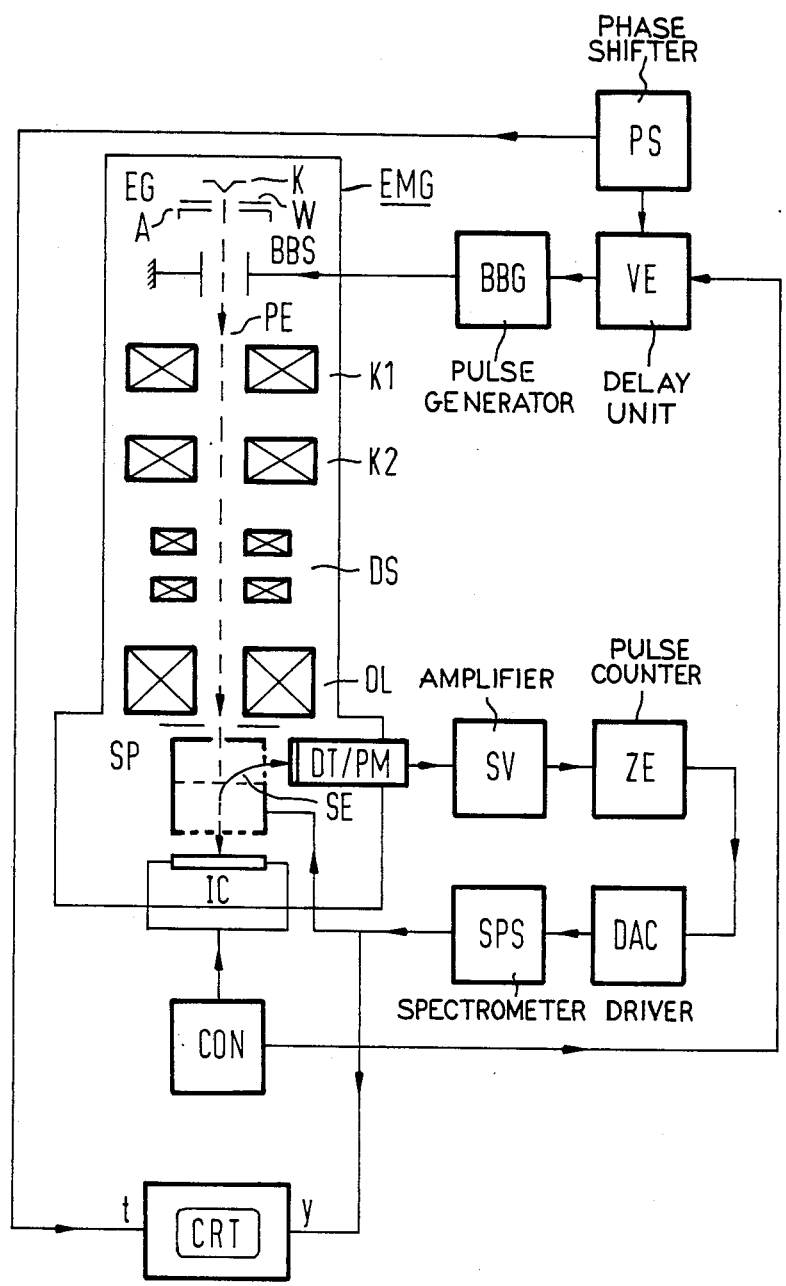

METHOD AND APPARATUS FOR MEASURING TIME DEPENDENT SIGNALS WITH A PARTICLE PROBE

BACKGROUND OF THE INVENTION

1. Field of the Invention

The present invention relates generally to a method for measuring time dependent signals by focusing a gated particle probe on a measuring point, as well as to an apparatus for practicing the method.

2. Description of the Prior Art

Checking the operation of VLSI (very large scale integrated) circuits is usually carried out in a computer-controlled test system so that malfunctions of a circuit module or chip are identified by measuring and analyzing the output signals therefrom, which result from bit patterns supplied to the module. In most cases, however, such test are incomplete since faulty circuit parts cannot be localized or, if they can be localized, it is only with a great expense and a highly complex apparatus. Additional measurements must therefore be made inside the circuit modules for fault identification, particularly during the development phase of the modules or chips. Electron beam measuring methods have proved particularly suitable for such purposes and are utilized in all regions of development and manufacture of microelectronic components. A person skilled in the art is familiar with the most widespread methods and practice, such as from the publication of H. P. Feuerbaum, "Electron Beam Testing: Methods and Applications", *Scanning*, Volume 5, pages 14–24 (1983).

Measuring the quantitative potential along a chronological curve at selected nodes of a component under test provides especially illuminating indications for localizing faults in VLSI circuits. This method is known, for example, from the publication by H. P. Feuerbaum, "VLSI Testing Using the Electron Probe", *Scanning Electron Microscopy*, 1971/1, pages 285–296. Disclosed therein is a primary electron beam generated in an electron-optical column of a modified scanning electron microscope which is positioned at a measuring point. The shift in energy distribution of secondary electrons triggered at the measuring point is identified using a spectrometer-detector arrangement, where the energy shift is dependent upon the potential of the component at the measuring point.

Quantitative measurements of a potential curve having a chronological resolution in the nanosecond range are only stroboscopically possible in accordance with the sampling principle. The sampling method, as used in electrical measuring technology, provides a primary electron beam pulsed synchronously at the frequency of a signal to be measured. The curve of the potential is continuously registered by shifting the keying time of the primary electron pulses. A high chronological resolution is achieved through the use of short primary electron pulses.

For shorter pulse durations, however, the signal level at the output of the spectrometer detector arrangement decreases greatly so that there is a high demand made on the measuring electronics. Since pulse widths of 100 picoseconds and probe currents of one nanoampere are obtainable with conventional beam blanking systems, the primary electron pulses statistically contain less than one electron. Thus, the current measurement usually carried out requires extremely high amplification.

Attempts have been made to further enhance the documentation sensitivity which defines the shortest pulse duration that results in an evaluatable signal and, thus, a possible chronological resolution. Such attempts have included enhancing the signal with the assistance of sensitive detectors and electron sources having highly directional characteristics (brightness). However, even when sample and hold methods are used, the highly amplified noise of the electronic components ultimately limits the obtainable documentation limit. This in turn limits the maximum possible chronlogical resolution.

SUMMARY OF THE PRESENT INVENTION

An object of the present invention is to nearly completely suppress the influence that noise of electrical components has on the achievable chronological resolution in a particle beam measuring instrument.

This and other objects of the present invention are achieved in a method for measuring time dependent signals at a measuring point using a particle probe, including counting the current pulses of the secondary particles, identifying the number of current pulses within a prescribed time interval and holding the number of current pulses per unit of time interval constant. The objects of the present invention are also achieved in an apparatus including a beam blanking system for synchronously gating a primary particle beam with a signal prior to impinging a measuring point on a specimen, an energy analyzer to detect shifts in energy distribution of secondary particles, and a feedback circuit at the output of the energy analyzer including a pulse counter and a digital-to-analog converter.

A particular advantage obtainable with the present invention is that the chronological resolution of the signal is essentially defined by the primary electron pulse duration, and not by the noise of the electronic components. It is also assured that the present arrangement for implementing the inventive method is easily integrated into the measuring electronics of conventional test systems.

Further developments of the present invention include standardizing the number of current pulses measured during a prescribed time interval according to the number of primary particles incident on the measuring point, and holding constant the ratio of the number of current pulses to the number of primary particles by using a feedback circuit. The number of primary particles incident on a measuring point are identified by determining the number of backscattered primary particles within a prescribed time interval. Additional measures include controlling an energy analyzer which detects the secondary particles by an analog signal derived from the number of current pulses per unit time, and providing an electrostatic retarding field spectrometer as the energy analyzer and using a photomultiplier at the output of a detector.

BRIEF DESCRIPTION OF THE DRAWING

The FIGURE is a schematic diagram of a scanning electron microscope including an apparatus for practicing a method of the present invention.

DESCRIPTION OF THE PREFERRED EMBODIMENTS

An arrangement for measuring time dependent signals in a specimen IC is shown in the FIGURE, including a primary electron beam PE for scanning over the specimen IC which is generated along an axis in an electron-optical column of an electron beam measuring unit EMG. The electron-optical column is essentially composed of an electron beam generator EG, a plurality of lens systems for beam shaping, beam deflecting, and beam focusing and a series of aperture diaphragms (not shown) which blank the primary electrons PE moving in orbits remote from the axis and, thus, contribute to improved image properties. The electrons are emitted from a cathode K and accelerated in the direction of an anode A, but are first focused in a first beam crossing point by a Wehnelt electrode W. So that fine primary electron beam PE is generated, the source image of the cathode K is subsequently transmitted as a greatly demagnified image onto the specimen IC to be tested with the assistance of condenser lenses K1 and K2 and an objective lens OL. The orbits of the primary electrons PE cross in further beam crossing points (crossover) after passing through the magnetic fields built-up by the individual lenses. A beam blanking system BBS that is driven by a pulse generator BBG is arranged at one of the beam crossing points. As a consequence of the requirement for adjustability of the beam blanking system BBS, the beam blanking system usually is formed of capacitor plates and is frequently installed only between the electron beam generator EG and the first condenser lens K1, as shown in the Figure.

The position of the primary electron beam PE relative to the specimen IC is established with the assistance of a deflection unit DS which is supplied with the deflection voltage from a scan generator (not shown). The deflection unit provides line-by-line deflection, or point-by-point deflection, of the primary electron beam PE.

A detector system DT formed of a shielding lattice, a scintillator, and a light conductor, along with a photomultiplier PM connected at the output, is provided to document secondary electrons SE which are triggered at a point on the specimen IC as a result of the interaction of the high energy primary electrons PE with the substance of the specimen IC. The current of the secondary electrons SE generates light pulses in the scintillator, which are converted into a secondary electrical signal in the photomultiplier PM. The secondary electron current, which is documented in the detector system DT, fluctuates due to the statistical character of the triggering process.

The detector system DT is preceded by a spectrometer SP arranged between the objective lens OL and the specimen IC. The spectrometer SP is preferably an electrostatic retarding field spectrometer which measures the shift of the energy distribution of the secondary electrons SE dependent upon the specimen potential. The retarding field spectrometer SP is generally composed of an extraction network of one or more planar or hemispherical retarding field electrodes, and of a deflection electrode for accelerating the secondary electrons SE in the direction of the scintillator.

The specimen IC is preferably an integrated circuit into which a suitable test program is fed by a specimen control CON. In accordance with the circuit structure of the specimen IC, the characteristic signals which define the respective operation conditions occur at nodes and interconnects during the test cycle and their chronological behavior is identified with the primary electron beam PE and compared to signal curves acquired by simulation calculations.

The chronological curve of a high frequency signal can, at present, be measured in an electron beam measuring unit EMG only by the sampling method of electrical mensuration. The primary electron beam PE is positioned relative to a point on the specimen. The specimen control CON drives a delay unit VE which in turn drives the pulse generator BBG so that the primary electron beam PE is keyed synchronously with the signal to be measured. When the measured signal is identified with the required signal-tonoise ratio, the phase relation to the primary electron pulses with respect to the potential of the measuring point is modified with the assistance of a phase shifter PS which drives the time delay unit VE. By continuously shifting the keying time of the primary electron pulses PE, a chronological curve of potential at a measuring point can be identified and may, for example, be displayed on a picture screen of a cathode ray tube CRT. Whereas a y-axis of the cathode ray tube CRT represents the measuring point potential as identified through the use of the spectrometer SP and a feedback circuit to keep the voltage difference between the specimen IC and the retarding field electrode constant, the x-deflection or time-axis is defined by the sawtooth voltage of the phase shifter PS.

To be able to measure high-frequency signal curves with the required chronological resolution, one is forced to work with extremely short primary electron pulses PE. For instance, pulse widths below one hundred picoseconds are obtainable with modern beam blanking systems BBS; this means that each primary electron pulses now contains statistically only about 0.6 electrons, given electron currents of one nanoampere. The secondary electron yield, in turn, lies in the order of magnitude of only one individual statistically appearing secondary electron being registered in the detector system. The individual secondary electrons generate current pulses at the output of the photomultiplier PM having different amplitudes and different chronological behaviors which are not integrated under such conditions. Without going to a great expense, current measurements carried out in the conventional arrangements, however, can only be carried out with higher amplifications using a photomultipler PM functioning at a constant gain factor, in other words, at high secondary electron currents.

These difficulties are avoided with the arrangement shown in the Figure, in that a current measurement is not carried out, but rather, the number of current pulses appearing at the output of the photomultiplier PM within a prescribed time interval and having an amplitude lying above a variable threshold is identified in a commercially available pulse counter ZE (Siemens AG, Counter B2070). The pulse counter ZE is advantageously preceded by a amplifier circuit SV in which the photomultiplier PM output signal is amplified and filtered for improved signal-to-noise ratio. The pulse counter ZE is followed by a digital-to-analog converter DAC which drives a spectrometer supply SPS by converting the digital signal corresponding to the number $\Delta N$ of current pulses $\Delta N/\Delta t$ measured within the prescribed time interval $\Delta t$ into an analog signal. For the present arrangement, it is not the current measured at the output of the photomultiplier PM, but instead, the number $\Delta N$ of current pulses generated by individual electrons and registered within the time interval $\Delta t$ which is kept constant by a feedback circuit composed of the pulse counter ZE, the digital-to-analog converter DAC, and the spectrometer drive SPS. The current pulses are kept constant by following up the voltage of the retarding field electrode.

To be able to separate the current pulses appearing within the time interval Δt from one another, fast photomultipliers PM and scintillators having short decay times should be used in the present arrangement.

To be able to at least partially correct the measuring errors caused by beam current fluctuations, it is advantageous to reference the number of current pulses ΔN/Δt counted within a prescribed time interval Δt to the number of primary electrons $\Delta N_{PE}$ incident on the specimen IC within the time interval Δt and, further, to keep the quotient $\Delta N/\Delta N_{PE}$ defined by these measured variables constant. For example, the number of primary electrons PE incident on the specimen IC within the time interval Δt can be identified using backscatter electrons measured in a detector DT.

The present invention has been set forth with reference to an electron beam measuring unit. Of course, it is not limited to such units. On the contrary, it can be adapted for use in any measuring unit in which a particle beam triggers secondary particles at a specimen.

Although other modifications and changes may be suggested by those skilled in the art, it is the intention of the inventors to embody within the patent warranted hereon all changes and modifications as reasonably and properly come within the scope of their contribution to the art.

We claim as our invention:

1. A method for measuring time dependent signals at a measuring point using a particle probe focused to at least one measuring point and gated synchronously with a predetermined signal, comprising:

identifying a shift in energy distribution of secondary particles triggered by the particle probe by an energy analyzer where the shift depends on the potential of the measuring point;

counting current pulses triggered by the secondary particles registered by the energy analyzer;

identifying the number of the current pulses measured at an output of the energy analyzer within a prescribed time interval; and holding constant the number of current pulses per unit of said time interval by a feedback circuit driving the energy analyzer.

2. A method as claimed in claim 1, further comprising:

standardizing the number of current pulses measured during said prescribed time interval to the number of primary particles incident on the measuring point within the time interval; and holding constant a quotient of the number of current pulses divided by the number of incident primary particles by the feedback circuit.

3. A method as claimed in claim 1, further comprising:

identifying the number of primary particles incident on a measuring point within the prescribed time interval by the number of backscatter primary particles registered within the time interval.

4. A method as claimed in claim 1, further comprising:

converting a digital signal representing the number of current pulses measured per unit of the time interval to an analog signal; and controlling the energy analyzer with said analog signal.

5. A method as claimed in claim 1, further comprising:

identifying the number of current pulses generated by a photomutliplier per unit of the time interval.

6. An apparatus for measuring time dependent signals at a measuring point by a particle probe, comprising:

a primary beam generator for producing a primary particle beam of the particle probe;

a beam blanking system for gating the primary particle beam synchronously with a signal prior to impinging a measuring point;

an energy analyzer to analyze a shift in energy distribution of secondary particles triggered by the particle probe at a measuring point where the shift is dependent on the potential of a measuring point;

a feedback circuit connected to control said energy analyzer to hold a signal measured at an output of the energy analyzer constant, said feedback circuit including:

a pulse counter connected to an output of said energy analyzer to count current pulses triggered by secondary particles registered in said energy analyzer; and a digital-to-analog converter connected at an output of said pulse counter and having an output connected to said energy analyzer.

7. An apparatus as claimed in claim 6, wherein said energy analyzer includes field spectrometer having an allocated detector system.

8. An apparatus as claimed in claim 7, further comprising:

a photomultiplier connected at an output of said detector system.

9. An apparatus as claimed in claim 6, further comprising:

an amplifier circuit connected between said energy analyzer and said pulse counter to amplify output signals from said energy analyzer.

* * * * *